United States Patent
Jin et al.

(10) Patent No.: US 10,305,064 B2
(45) Date of Patent: May 28, 2019

(54) FLEXIBLE ORGANIC LIGHT EMITTING DIODE DISPLAY AND MANUFACTURING METHOD THEREOF

(71) Applicant: Wuhan China Star Optoelectronics Technology Co., Ltd., Wuhan, Hubei (CN)

(72) Inventors: Jiangjiang Jin, Wuhan (CN); Bokun Su, Wuhan (CN); Hsiang-lun Hsu, Wuhan (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 15/572,540

(22) PCT Filed: Jun. 9, 2017

(86) PCT No.: PCT/CN2017/087791
§ 371 (c)(1),
(2) Date: Nov. 8, 2017

(87) PCT Pub. No.: WO2018/196115
PCT Pub. Date: Nov. 1, 2018

(65) Prior Publication Data
US 2018/0315956 A1   Nov. 1, 2018

(30) Foreign Application Priority Data
Apr. 28, 2017   (CN) ............ 2017 1 0293072

(51) Int. Cl.
*H01L 27/32* (2006.01)
*H01L 51/56* (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ..... H01L 51/50; H01L 51/5253; H01L 51/56; H01L 27/3244
(Continued)

(56) References Cited

U.S. PATENT DOCUMENTS

2003/0138945 A1* 7/2003 McAllister .......... A61L 27/3886
435/325
2008/0238301 A1   10/2008 Shim et al.
(Continued)

FOREIGN PATENT DOCUMENTS

CN   101794810 A   8/2010
CN   102870250 A   1/2013
(Continued)

*Primary Examiner* — Long K Tran
(74) *Attorney, Agent, or Firm* — Mark M. Friedman

(57) ABSTRACT

A flexible organic light emitting diode display and a manufacturing method are provided. The method includes steps of forming an active array layer and an organic light emitting display layer sequentially on a flexible substrate, forming a protective layer on the organic light emitting display layer, forming an organic layer on the protective layer, wherein a cross section of the organic layer is trapezoidal, and forming an inorganic layer on the organic layer.

20 Claims, 3 Drawing Sheets

(51) Int. Cl.
*H01L 51/52* (2006.01)
*H01L 51/00* (2006.01)

(52) U.S. Cl.
CPC ........ *H01L 51/56* (2013.01); *H01L 2227/323* (2013.01); *H01L 2251/5338* (2013.01)

(58) Field of Classification Search
USPC .......................................................... 257/40
See application file for complete search history.

(56) References Cited

U.S. PATENT DOCUMENTS

| | | |
|---|---|---|
| 2008/0309226 A1 | 12/2008 | Kim |
| 2010/0181903 A1 | 7/2010 | Kim |
| 2012/0146492 A1 | 6/2012 | Ryu |
| 2013/0207083 A1 | 8/2013 | Young |
| 2014/0017336 A1* | 1/2014 | Sides ...................... A61K 33/36 |
| | | 424/623 |
| 2016/0204374 A1 | 7/2016 | Sonoda et al. |
| 2017/0005292 A1 | 1/2017 | Lee et al. |
| 2017/0299773 A1* | 10/2017 | Guo .................... H01L 51/0096 |

FOREIGN PATENT DOCUMENTS

| | | |
|---|---|---|
| CN | 105493627 A | 4/2016 |
| CN | 106328671 A | 1/2017 |
| CN | 106531904 A | 3/2017 |

* cited by examiner

FLEXIBLE ORGANIC LIGHT EMITTING DIODE DISPLAY AND MANUFACTURING METHOD THEREOF

FIELD OF THE INVENTION

The present disclosure relates to the technical field of displays, and in particular to a flexible organic light emitting diode display and manufacturing method thereof.

BACKGROUND OF THE DISCLOSURE

Organic light emitting diodes (OLED), also known as organic electroluminescence displays, have self-luminance, large viewing angles, and reduced energy consumption characteristics. Organic light emitting diodes are widely used in mobile devices, such as smart phones and OLED TVs. OLEDs, and can be prepared not only on glass substrates, but also on flexible substrates.

However, the encapsulation reliability of the conventional organic light emitting diode display is poor, because water and oxygen molecules in the air diffuse to an organic light-emitting display layer through an encapsulation layer and corrode the organic light emitting display layer, resulting in a short lifespan and low efficiency of the OLEDs.

Therefore, it is necessary to provide a flexible organic light emitting diode display and a manufacturing method thereof to solve the problem existing in the prior art.

SUMMARY OF THE INVENTION

A primary object of the present disclosure is to provide a flexible organic light emitting diode display and a manufacturing method, which improve the packaging reliability and thereby increase the product lifespan.

To achieve the above object, the present disclosure provides a method of manufacturing a flexible organic light emitting diode display, comprising steps of:
  sequentially forming an active array layer and an organic light emitting display layer on a flexible substrate;
  forming a protective layer on the organic light emitting display layer;
  forming an organic layer on the protective layer, wherein a cross section of the organic layer is trapezoidal, the organic layer has two bottom angles, each of which is less than 70°, and a thickness of the organic layer ranges from 0.5 µm to 20 µm; and
  forming an inorganic layer on the organic layer.

In the method for manufacturing the flexible organic light emitting diode display of the present disclosure, a material of the protective layer is an inorganic material, and a thickness of the protective layer ranges from 100 nm to 2 µm.

In the method for manufacturing the flexible organic light emitting diode display of the present disclosure, a material of the protective layer includes at least one of zirconium aluminate, graphene, alumina, zirconium dioxide, zinc oxide, silicon nitride, silicon carbonitride, $SiO_x$, titanium dioxide, and diamond-like carbon.

In the method for manufacturing the flexible organic light emitting diode display of the present disclosure, a material of the protective layer includes an organic material and inorganic nanoparticles.

In the method for manufacturing the flexible organic light emitting diode display of the present disclosure, a thickness of the protective layer ranges from 0.5 µm to 2 µm.

In the method for manufacturing the flexible organic light emitting diode display of the present disclosure, the inorganic nanoparticles include at least one of a metal oxide, a metal sulfide, a non-metallic oxide, and a non-metallic sulfide.

In the method for manufacturing the flexible organic light emitting diode display of the present disclosure, the organic material includes one of an acrylic material, an epoxy resin material, and a silicone material.

The present disclosure further provides a method of manufacturing a flexible organic light emitting diode display, comprising steps of:
  sequentially forming an active array layer and an organic light emitting display layer on a flexible substrate;
  forming a protective layer on the organic light emitting display layer;
  forming an organic layer on the protective layer, wherein a cross section of the organic layer is trapezoidal; and
  forming an inorganic layer on the organic layer.

In the method for manufacturing the flexible organic light emitting diode display of the present disclosure, the organic layer has two bottom angles, each of which is less than 70°.

In the method for manufacturing the flexible organic light emitting diode display of the present disclosure, a thickness of the organic layer ranges from 0.5 µm to 20 µm.

In the method for manufacturing the flexible organic light emitting diode display of the present disclosure, a material of the protective layer is an inorganic material, and a thickness of the protective layer ranges from 100 nm to 2 µm.

In the method for manufacturing the flexible organic light emitting diode display of the present disclosure, a material of the protective layer includes at least one of zirconium aluminate, graphene, alumina, zirconium dioxide, zinc oxide, silicon nitride, silicon carbonitride, $SiO_x$, titanium dioxide, and diamond-like carbon.

In the method for manufacturing the flexible organic light emitting diode display of the present disclosure, a material of the protective layer includes an organic material and inorganic nanoparticles.

In the method for manufacturing the flexible organic light emitting diode display of the present disclosure, a thickness of the protective layer ranges from 0.5 µm to 2 µm.

In the method for manufacturing the flexible organic light emitting diode display of the present disclosure, the inorganic nanoparticles include at least one of a metal oxide, a metal sulfide, a non-metallic oxide, and a non-metallic sulfide.

In the method for manufacturing the flexible organic light emitting diode display of the present disclosure, the organic material includes one of an acrylic material, an epoxy resin material, and a silicone material.

The present disclosure further provides a flexible organic light emitting diode display, comprising:
  a flexible substrate;
  an active array layer disposed on the flexible substrate;
  an organic light emitting display layer disposed on the active array layer;
  a protective layer disposed on the organic light emitting display layer, wherein a cross section of the organic layer is trapezoidal; and
  an inorganic layer disposed on the organic layer.

In the flexible organic light emitting diode display of the present disclosure, the organic layer has two bottom angles, each of which is less than 70°.

In the flexible organic light emitting diode display of the present disclosure, a thickness of the organic layer ranges from 0.5 μm to 20 μm.

In the flexible organic light emitting diode display of the present disclosure, a material of the protective layer includes an organic material and inorganic nanoparticles.

In the flexible organic light emitting diode display of the present disclosure and the manufacturing method thereof, the edges of the organic layer are processed, so that the transition from the highest point to the lowest point is smoothed, thereby facilitating the deposit of a uniform inorganic layer on the organic layer, hence improving the reliability of the flexible packaging layer, and increasing the lifespan of the OLEDs.

DETAILED DESCRIPTION OF THE PREFERRED EMBODIMENTS

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc., are only directions with regard to the accompanying drawings. Therefore, the directional terms used for describing and illustrating the present disclosure are not intended to limit the present disclosure. In the figures, similar units are indicated by the same reference numbers.

Figure 1:
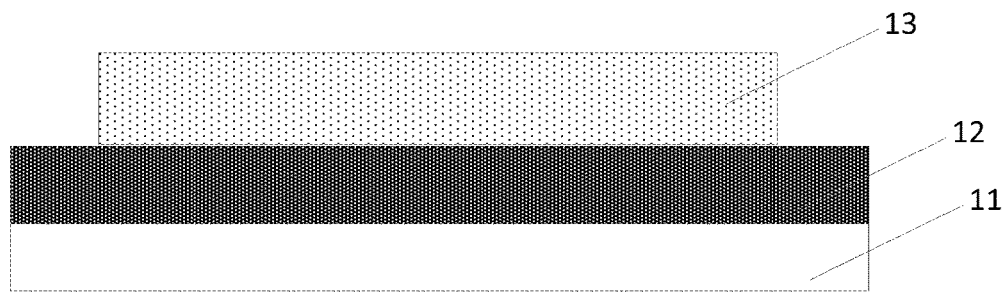
FIG. 1 is a schematic view of a first step of a first method for manufacturing a flexible organic light emitting diode display of the present disclosure.

Refer to FIG. 1, which is a schematic view of a first step of a first method for manufacturing a flexible organic light emitting diode display of the present disclosure.

As shown in FIG. 1, a method of manufacturing a flexible organic light emitting diode display of the present disclosure includes the following steps:

In Step S101, an active array layer and an organic light emitting display layer are formed on a flexible substrate.

As shown in FIG. 1, the active array layer 12 and the organic light emitting display layer 13 are sequentially formed on the flexible substrate 11. The active array layer 12 has a plurality of thin film transistors including a gate, a source, and a drain. The active array layer 12 includes an active layer, which is used for forming channels, a gate insulating layer, a first metal layer, an interlayer insulating layer, and a second metal layer.

The organic light emitting display layer 13 is located on the active array layer 12. The organic light emitting display layer 13 includes an organic light emitting unit, wherein the organic light emitting unit is electrically connected to the active array layer 12, and more specifically the organic light emitting unit is connected to the drain of the thin film transistor.

In Step S102, a first inorganic layer is formed on the organic light emitting display layer.

Figure 2:
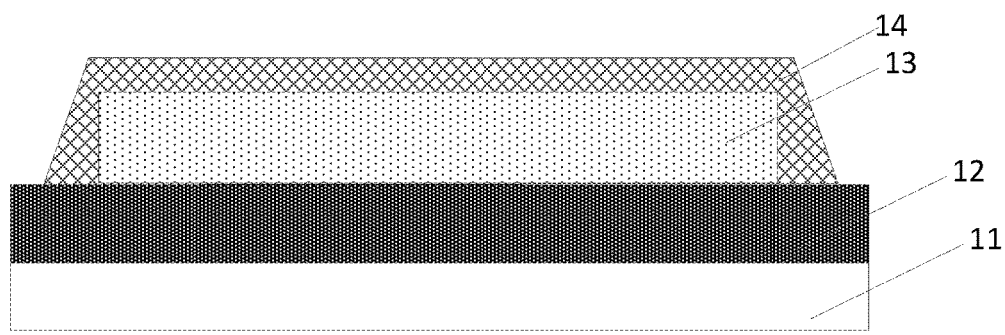
FIG. 2 is a schematic view of a second step of the first method for manufacturing a flexible organic light emitting diode display of the present disclosure.

As shown in FIG. 2, the first inorganic layer 14 is formed on the organic light emitting display layer 13 as a protective layer. For example, the first inorganic layer 14 is deposited by one of the methods, such as atomic layer deposition (ALD), pulsed laser deposition (PLD), sputtering, and plasma enhanced chemical vapor deposition (PECVD).

Thickness of the first inorganic layer 14 ranges from 100 nm to 2 μm. When the thickness is within this range, the first inorganic layer may effectively block outside moisture and oxygen without increasing thickness of the display.

Material of the first inorganic layer 14 includes at least one of $ZrAl_xO_y$ (zirconium aluminate), graphene, alumina ($Al_2O_3$), zirconium dioxide ($ZrO_2$), zinc oxide ($ZnO_2$), silicon nitride ($SiN_x$), silicon carbonitride (SiCN), $SiO_x$, titanium dioxide ($TiO_2$), and diamond-like carbon (DLC). Since these materials are insoluble in water and do not react with oxygen, corrosion resistance is strong, so that the first inorganic layer 14 has effective blocking moisture and oxygen characteristics. Thus, the organic light emitting units may be effectively prevented from being corroded.

In Step S103, an organic layer is formed on the first inorganic layer, wherein a cross section of the organic layer is trapezoidal.

Figure 3:
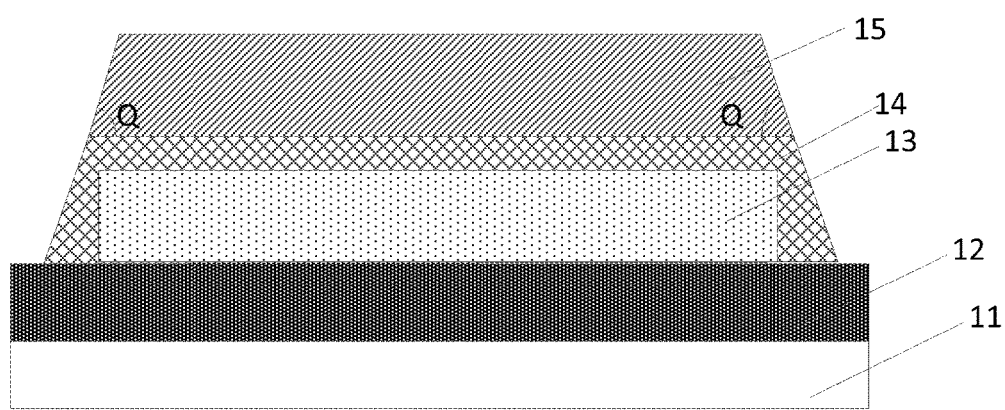
FIG. 3 is a schematic view of a third step of the first method for manufacturing a flexible organic light emitting diode display of the present disclosure.

As shown in FIG. 3, the organic layer 15 is formed on the first inorganic layer 14. The organic layer 15 is formed by coating methods such as organic photolithography, inkjet printing (IJP), spin-coating, slot coating, etc., wherein the cross section of the organic layer is trapezoidal. Since shape of the organic layer is set to be trapezoidal, edges of the organic layer smoothly transit from a highest point to a lowest point, thereby facilitating the deposit of a uniform inorganic layer on the organic layer, hence preventing components of the flexible OLED from cracking or preventing moisture and oxygen from diffusion.

The organic layer 15 has two bottom angles Q, each of which is less than 70°, that is, the angle between the highest point and the lowest point at the edge of the organic layer 15 is less than 70°. When the angle is within the above range, the edges of the organic layer more smoothly transit from the highest point to the lowest point, thereby facilitating the deposit of a more uniform inorganic layer on the organic layer, hence effectively preventing the components of the flexible OLED from cracking and preventing moisture and oxygen from diffusion.

Thickness of the organic layer 15 ranges from 0.5 μm to 20 μm. When the thickness is within this range, the organic layer 15 may effectively block outside moisture and oxygen without increasing the thickness of the display. The material of the organic layer may be, but is not limited to, an acrylic type material, a silane type material, and an epoxy resin type material.

In Step S104, a second inorganic layer is formed on the organic layer.

Figure 4:
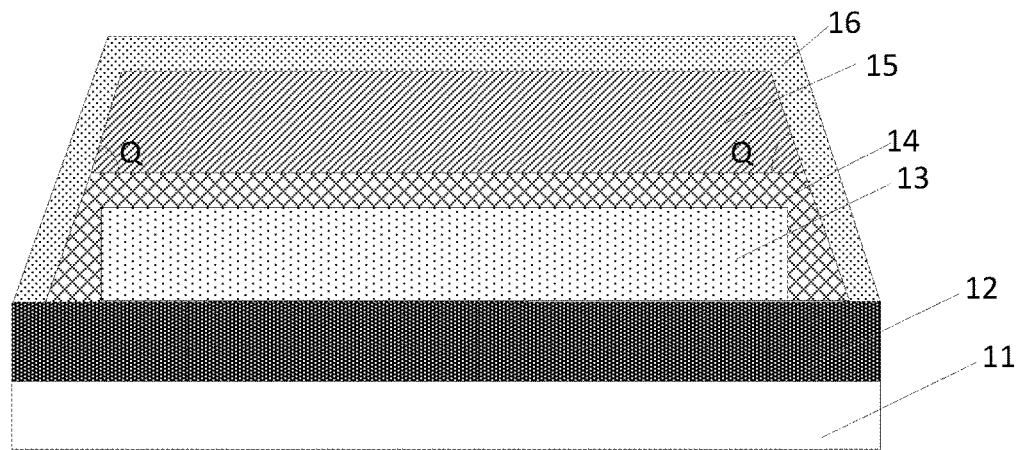
FIG. 4 is a schematic view of a fourth step of the first method for manufacturing a flexible organic light emitting diode display of the present disclosure.

As shown in FIG. 4, the second inorganic layer 16 is formed on the organic layer 15.

For example, the second inorganic layer 16 may be deposited by one of the methods, such as atomic layer deposition, pulsed laser deposition, sputtering, plasma enhanced chemical vapor deposition, etc. The thickness of the second inorganic layer 16 may be the same as the thickness of the first inorganic layer 14. The material of the second inorganic layer 16 may be the same as the material of the first inorganic layer 14.

The embodiment of the present disclosure provides a flexible organic light emitting diode display which includes a flexible substrate 11, an active array layer 12, an organic light emitting display layer 13, a first inorganic layer 14, an organic layer 15, and a second inorganic layer 16.

The active array layer 12 is disposed on the flexible substrate 11. The organic light emitting display layer 13 is disposed on the active array layer 12. The first inorganic layer 14 is disposed on the organic light emitting display layer 13. The organic layer 15 is disposed on the first inorganic layer 14, wherein a cross section of the organic layer 15 is trapezoidal, and the organic layer 15 has two bottom angles, each of which is less than 70°. The second inorganic layer 16 is disposed on the organic layer 15.

In the flexible organic light emitting diode display of the present disclosure and the manufacturing method thereof, the edges of the organic layer are processed, so that the transition from the highest point to the lowest point is smoothed, thereby facilitating the deposit of a uniform inorganic layer on the organic layer, hence improving the reliability of the flexible packaging layer, and increasing the lifespan of the OLEDs.

Figure 5:
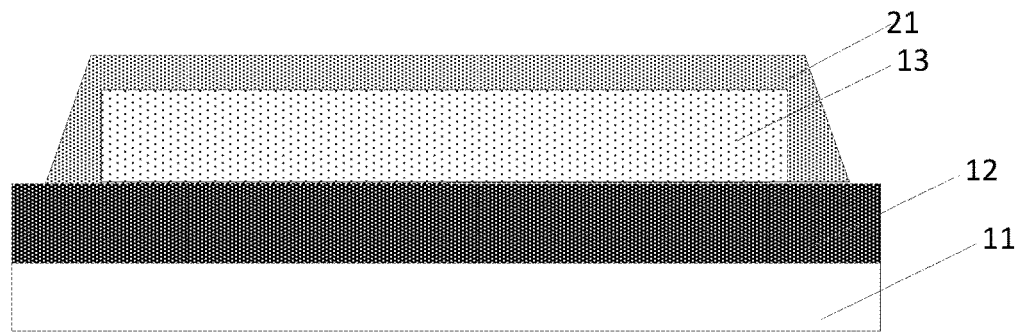
FIG. 5 is a schematic view of a second step of a second method for manufacturing a flexible organic light emitting diode display of the present disclosure.

FIG. 5 is a schematic view of a second step of a second method for manufacturing a flexible organic light emitting diode display of the present disclosure.

As shown in FIG. 5, a method for manufacturing a flexible organic light emitting diode display in the present embodiment includes the following steps:

In Step S201, an active array layer and an organic light emitting display layer are formed on the flexible substrate.

Returning to FIG. 1, the active array layer 12 and the organic light emitting display layer 13 are sequentially formed on the flexible substrate 11. The active array layer 12 has a plurality of thin film transistors including a gate, a source, and a drain. The active array layer 12 includes an active layer, which is used for forming channels, a gate insulating layer, a first metal layer, an interlayer insulating layer, and a second metal layer.

The organic light emitting display layer 13 is located on the active array layer 12. The organic light emitting display layer 13 includes an organic light emitting unit, wherein the organic light emitting unit is electrically connected to the active array layer 12, and more specifically the organic light emitting unit is connected to the drain of the thin film transistor.

In Step S202, an organic composite layer is formed on the organic light emitting display layer.

As shown in FIG. 5, the organic composite layer 21 is formed on the organic light emitting display layer 13 as a protective layer. The thickness of the organic composite layer 21 ranges from 0.5 μm to 2 μm. When the thickness is within this range, the organic composite layer may effectively block outside moisture and oxygen without increasing the thickness of the display.

Material of the organic composite layer 21 includes an organic material and inorganic nanoparticles uniformly dispersed in the organic material, so as to form a nano-organic composite layer having a refractive index of more than 1.8. The inorganic nanoparticles include at least one of a metal oxide, a metal sulfide, a non-metallic oxide, and non-metallic sulfide. The organic material may be at least one of an acrylic type material, an epoxy resin type material, and an organosilicon type material. In addition, the organic composite layer 21 further improves the luminous efficiency of the organic light emitting diode.

In Step S203, an organic layer is formed on the organic composite layer, wherein the cross section of the organic layer is trapezoidal.

Figure 6:
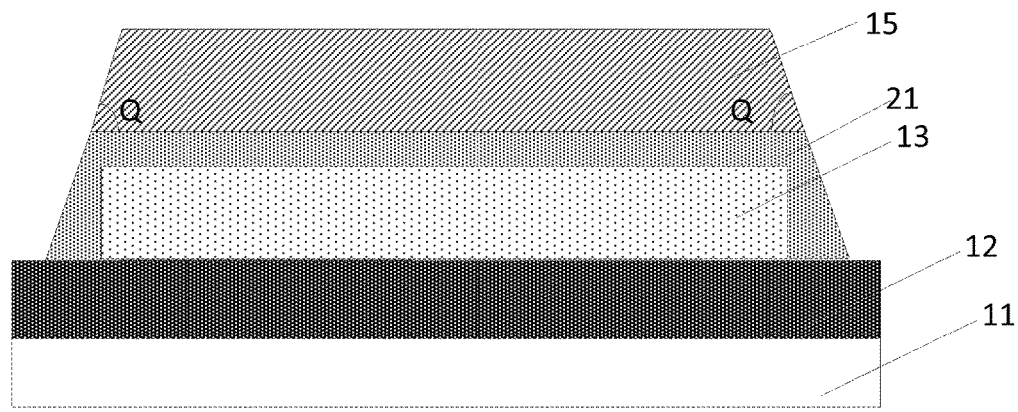
FIG. 6 is a schematic view of a third step of the second method for manufacturing a flexible organic light emitting diode display of the present disclosure.

As shown in FIG. 6, the organic layer 15 is formed on the organic composite layer 14. The organic layer 15 is formed by coating methods such as organic photolithography, inkjet printing (IJP), spin-coating, slot coating, etc., wherein the cross section of the organic layer is trapezoidal. Since the shape of the organic layer is set to be trapezoidal, the edges of the organic layer smoothly transit from the highest point to the lowest point, thereby facilitating the deposit of a uniform inorganic layer on the organic layer, hence preventing the components of the flexible OLED from cracking and preventing moisture and oxygen from diffusion.

The organic layer 15 has two bottom angles Q, each of which is less than 70°, that is, the angle between the highest point and the lowest point at the edge of the organic layer 15 is less than 70°. When the angle is within the above range, the edges of the organic layer more smoothly transit from the highest point to the lowest point, thereby facilitating the deposit of a more uniform inorganic layer on the organic layer, hence effectively preventing the components of the flexible OLED from cracking and preventing moisture and oxygen from diffusion.

The thickness of the organic layer 15 ranges from 0.5 μm to 20 μm. When the thickness is within this range, the organic layer 15 may effectively block outside moisture and oxygen without increasing the thickness of the display. The material of the organic layer may be, but is not limited to, an acrylic type material, a silane type material, and an epoxy resin type material.

In Step S204, a second inorganic layer is formed on the organic layer.

Figure 7:
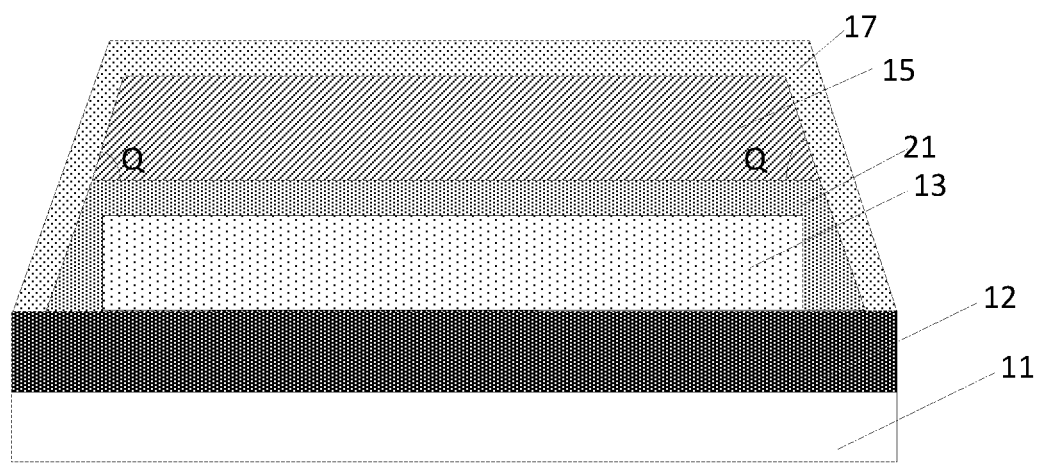
FIG. 7 is a schematic view of a fourth step of the second method for manufacturing a flexible organic light emitting diode display of the present disclosure.

As shown in FIG. 7, the inorganic layer 17 is formed on the organic layer 15.

For example, the second inorganic layer 16 may be deposited by one of the methods, such as atomic layer deposition, pulsed laser deposition, sputtering, plasma enhanced chemical vapor deposition, etc. The thickness of the inorganic layer 17 may be the same as the thickness of the first inorganic layer 14.

The embodiment of the present disclosure provides a flexible organic light emitting diode display, which includes a flexible substrate 11, an active array layer 12, an organic light emitting display layer 13, an organic composite layer 21, an organic layer 15, and an inorganic layer 17.

The active array layer 12 is disposed on the flexible substrate 11. The organic light emitting display layer 13 is disposed on the active array layer 12. The organic composite layer 21 is disposed on the organic light emitting display layer 13. The organic layer 15 is disposed on the organic composite layer 21, wherein a cross section of the organic layer 15 is trapezoidal, and the organic layer 15 has two bottom angles, each of which is less than 70°. The inorganic layer 17 is disposed on the organic layer 15.

In the flexible organic light emitting diode display of the present disclosure and the manufacturing method thereof, the edges of the organic layer are processed, so that the transition from the highest point to the lowest point is smoothed, thereby facilitating the deposit of a uniform inorganic layer on the organic layer, hence improving the reliability of the flexible packaging layer, and increasing the lifespan of the OLEDs.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A method of manufacturing a flexible organic light emitting diode display, comprising steps of:
    forming an active array layer and an organic light emitting display layer sequentially on a flexible substrate;
    forming a protective layer on the organic light emitting display layer;
    forming an organic layer on the protective layer, wherein a cross section of the organic layer is trapezoidal and has two bottom angles, each of the bottom angles is less than 70°, and a thickness of the organic layer ranges from 0.5 µm to 20 µm; and
    forming an inorganic layer on the organic layer and the protective layer, wherein the inorganic layer covers a lateral surface of the organic layer and a lateral surface of the protective layer.

2. The method for manufacturing the flexible organic light emitting diode display as claimed in claim 1, wherein a material of the protective layer is an inorganic material, and a thickness of the protective layer ranges from 100 nm to 2 µm.

3. The method for manufacturing the flexible organic light emitting diode display as claimed in claim 2, wherein a material of the protective layer includes at least one of zirconium aluminate, graphene, alumina, zirconium dioxide, zinc oxide, silicon nitride, silicon carbonitride, $SiO_x$, titanium dioxide, and diamond-like carbon.

4. The method for manufacturing the flexible organic light emitting diode display as claimed in claim 1, wherein a material of the protective layer includes an organic material and inorganic nanoparticles.

5. The method for manufacturing the flexible organic light emitting diode display as claimed in claim 4, wherein a thickness of the protective layer ranges from 0.5 µm to 2 µm.

6. The method for manufacturing the flexible organic light emitting diode display as claimed in claim 4, wherein the inorganic nanoparticles include at least one of a metal oxide, a metal sulfide, a non-metallic oxide, and a non-metallic sulfide.

7. The method for manufacturing the flexible organic light emitting diode display as claimed in claim 4, wherein the organic material includes one of an acrylic material, an epoxy resin material, and a silicone material.

8. A method of manufacturing a flexible organic light emitting diode display, comprising steps of:
    forming an active array layer and an organic light emitting display layer sequentially on a flexible substrate;
    forming a protective layer on the organic light emitting display layer;
    forming an organic layer on the protective layer, wherein a cross section of the organic layer is trapezoidal; and
    forming an inorganic layer on the organic layer and the protective layer, wherein the inorganic layer covers a lateral surface of the organic layer and a lateral surface of the protective layer.

9. The method for manufacturing the flexible organic light emitting diode display as claimed in claim 8, wherein the organic layer has two bottom angles, each of which is less than 70°.

10. The method for manufacturing the flexible organic light emitting diode display as claimed in claim 8, wherein a thickness of the organic layer ranges from 0.5 µm to 20 µm.

11. The method for manufacturing the flexible organic light emitting diode display as claimed in claim 8, wherein a material of the protective layer is an inorganic material, and a thickness of the protective layer ranges from 100 nm to 2 µm.

12. The method for manufacturing the flexible organic light emitting diode display as claimed in claim 11, wherein a material of the protective layer includes at least one of zirconium aluminate, graphene, alumina, zirconium dioxide, zinc oxide, silicon nitride, silicon carbonitride, $SiO_x$, titanium dioxide, and diamond-like carbon.

13. The method for manufacturing the flexible organic light emitting diode display as claimed in claim 8, wherein a material of the protective layer includes an organic material and inorganic nanoparticles.

14. The method for manufacturing the flexible organic light emitting diode display as claimed in claim 13, wherein a thickness of the protective layer ranges from 0.5 µm to 2 µm.

15. The method for manufacturing the flexible organic light emitting diode display as claimed in claim 13, wherein the inorganic nanoparticles include at least one of a metal oxide, a metal sulfide, a non-metallic oxide, and a non-metallic sulfide.

16. The method for manufacturing the flexible organic light emitting diode display as claimed in claim 13, wherein the organic material includes one of an acrylic material, an epoxy resin material, and a silicone material.

17. A flexible organic light emitting diode display, comprising:
    a flexible substrate;
    an active array layer disposed on the flexible substrate;
    an organic light emitting display layer disposed on the active array layer;
    a protective layer disposed on the organic light emitting display layer;
    an organic layer disposed on the protective layer, wherein a cross section of the organic layer is trapezoidal and has two bottom angles; and
    an inorganic layer disposed on the organic layer and the protective layer, wherein the inorganic layer covers a lateral surface of the organic layer and a lateral surface of the protective layer.

18. The flexible organic light emitting diode display as claimed in claim 17, wherein the organic layer has two bottom angles, each of which is less than 70°.

19. The flexible organic light emitting diode display as claimed in claim 17, wherein a thickness of the organic layer ranges from 0.5 µm to 20 µm.

20. The flexible organic light emitting diode display as claimed in claim 17, wherein a material of the protective layer includes an organic material and inorganic nanoparticles.

* * * * *